United States Patent [19]

Arvanitis

[11] 4,207,535
[45] Jun. 10, 1980

[54] TWO-POLE, FIXED-TUNED MONOLITHIC CRYSTAL FREQUENCY DISCRIMINATOR

[75] Inventor: Aristotelis S. Arvanitis, Addison, Ill.

[73] Assignee: Motorola, Inc., Schaumburg, Ill.

[21] Appl. No.: 888,123

[22] Filed: Mar. 20, 1978

[51] Int. Cl.² .............................................. H03D 3/16
[52] U.S. Cl. ................................ 329/118; 329/205 R; 333/192
[58] Field of Search ............... 329/117, 118, 198, 204, 329/205 R, 140; 310/320, 366; 333/72, 189–192

[56] References Cited

U.S. PATENT DOCUMENTS

| | | | |
|---|---|---|---|
| 2,248,776 | 7/1941 | Och | 333/188 |
| 3,487,318 | 12/1969 | Herman | 329/117 |
| 4,006,437 | 2/1977 | Simpson et al. | 333/72 |

*Primary Examiner*—Siegfried H. Grimm
*Attorney, Agent, or Firm*—Donald B. Southard; James W. Gillman

[57] ABSTRACT

A two-pole fixed-tuned monolithic crystal frequency discriminator circuit is provided wherein a tuned circuit is utilized connected between the center pin of the two-pole crystal device and ground. In this manner, two bandpass filters are effectively provided wherein the respective outputs thereof may be rectified and combined so as to obtain the desired audio output. The result is a two-pole discriminator device with the linear portion of the conventional "S" curve having a substantially wider response characteristic than for any heretofore known monolithic crystal discriminator. Additionally, it does not need further tuning adjustments and it exhibits substantially better temperature stability and small size as well as a cost saving in manufacture as compared to a comparable three-pole device.

6 Claims, 5 Drawing Figures

TWO-POLE, FIXED-TUNED MONOLITHIC CRYSTAL FREQUENCY DISCRIMINATOR

BACKGROUND OF THE INVENTION

The present invention relates in general to frequency discriminators and more particularly to a novel two-pole crystal monolithic frequency discriminator of improved operating characteristics.

Present day radio communications requirements, and particularly for voice communication, demand narrow-band operation so as to maximize a number of available channels. Conventionally, the deviation of a frequency modulation channel is restricted to five kHz or less. At high frequency operation, say, 150 mHz or above, the demodulation of such narrow-band carrier signals present significant difficulties, particularly since the more conventional demodulator apparatus or frequency discriminators are relatively complex in operation, not to mention the additional problems in tuning and alignment customarily required.

One approach to the foregoing has been the utilization of crystal discriminator arrangements which achieve very narrow passbands, without complex circuitry, and which demodulate the received carrier signals directly, or at least the heterodyned intermediate carrier signals of a relatively high frequency. The crystal discriminator referred to customarily comprises a plurality of electrodes, usually three pairs, on a single crystal blank or wafer. One such pair serves as the input resonator while the remaining two function as two output resonators. The input resonator is tuned to the carrier or intermediate frequency, as the occasion may be, with the two output resonators tuned to slightly higher and slightly lower frequencies, respectively. By making the various electrodes sufficiently massive to achieve energy trapping, significant decoupling occurs between the input and the output resonators, and a relatively narrow passband results. More particularly, the energy coupled out of the input resonator to each of the two output resonators forms respective stagger-tuned pass bands, which do not coincide with one another. The high and low band output frequencies may be suitably detected and combined subtractively to recover the desired modulation at audio frequencies as contained therein.

While the referenced prior crystal discriminators may be entirely satisfactory in certain applications, there nevertheless are others where they are not suited. Three-pole devices are obviously more costly and difficult to fabricate than the less complicated two-pole devices. For miniaturized electronic apparatus, such as, say portable, and hand held communication apparatus, space is an extremely important factor and may in fact be critical. Tuning, and the attendant circuit components required, simply cannot be tolerated. Yet, at the same time, there are instances where a somewhat wider bandwidth is desired, indeed is mandated, than what has heretofore been obtainable in prior two-pole monolithic crystal devices.

SUMMARY OF THE INVENTION

Accordingly, it is an object of the present invention to provide a novel two-pole, fixed-tuned crystal discriminator arrangement which overcomes the foregoing referenced deficiencies.

A more particular object of the present invention is to provide a two-pole crystal discriminator of the foregoing type which effectively functions as a three-pole network with improved, i.e., wider, bandwidth characteristics than heretofore been obtainable with such devices.

Still another object of the present invention is to provide a two-pole crystal discriminator of the foregoing type which exhibits reduced size and space requirements and wherein additional tuning adjustments are not required.

In practicing the invention, a two-pole, fixed-tuned, monolithic crystal frequency discriminator is provided for deriving the audio output from a received radio frequency modulated carrier signal. The crystal frequency discriminator device includes a monolithic wafer body of piezoelectric material on which first and second pairs of electrodes have been deposited so as to form resonator means having a mass for responding to a modulated input signal of a given reference frequency. One electrode of the first electrode pair forms a first port and serves as an input to the crystal discriminator device, and wherein one electrode of the second electrode pair forms a second port and serves as one output of the crystal discriminator. The other electrodes of the first and second electrode pairs are interconnected and form still a third port to serve as a second output of the crystal discriminator device. A tuned circuit is interconnected between the third port and ground and wherein the output at the third port is thereby modified by this tuned circuit. In this manner, a first bandpass filter is formed between the first port, or input electrode, and the third port and which is modified by the referenced tuned circuit. Still another bandpass filter is formed between the second port formed by the referenced output electrode and the first port and wherein the response thereof is modified by the external coupling thereto. In any event, the center frequency of each of the reference bandpass filters is somewhat different and, accordingly, forms a respective peak of the conventional "S" curve when the respective output signals from the second and third ports are rectified and combined to form an amplitude modulated signal proportional to the received radio frequency signal.

BRIEF DESCRIPTION OF THE DRAWINGS

The features of the present invention which are believed to be novel are set forth with particularity in the appended claims. The invention itself, however, together with further objects and advantages thereof, may be best understood by reference to the following description when taken in conjunction with the accompanying drawings, in which like reference numerals refer to like elements in the several figures, and in which:

DETAILED DESCRIPTION OF THE PREFERRED EMBODIMENT

Figure 1:
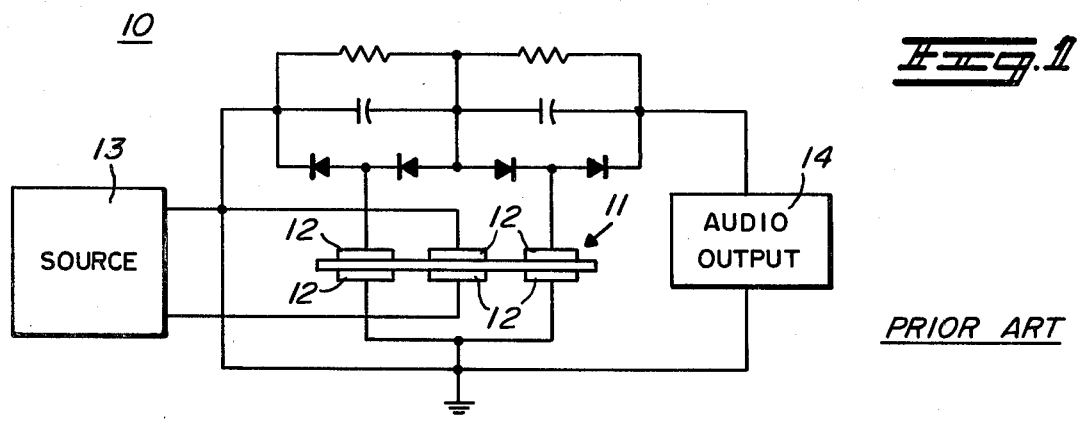
FIG. 1 is a schematic representation of a three-pole crystal discriminator device which may be taken as typical of the prior art.

Referring now to the drawings, a frequency discriminator circuit arrangement is shown at 10 in FIG. 1 which device may be taken as representative of the crystal discriminators heretofore known in the prior art. Note that the monolithic crystal device 11 is comprised of a piezoelectric wafer and three separate electrode pairs 12. Typically, the center electrode pair is resonated at a given center frequency and receives the signals from the source indicated at 13. The two remaining electrode pairs serve as respective outputs and are tuned respectively to frequencies below and above the center frequency at which the center electrode pair resonates at. The outputs then may be rectified and combined to form the audio output of the discriminator device as identified at 14. Note that three separte electrode pairs are required. As a result, it can be appreciated that, as such, it necessarily is more costly to manufacture than the conventional two-pole crystal device. The 3-pole crystal device itself must accordingly be somewhat larger than that of a two-pole crystal device and manufacturing tolerances for the former must necessarily be relaxed to some extent.

Figure 2:
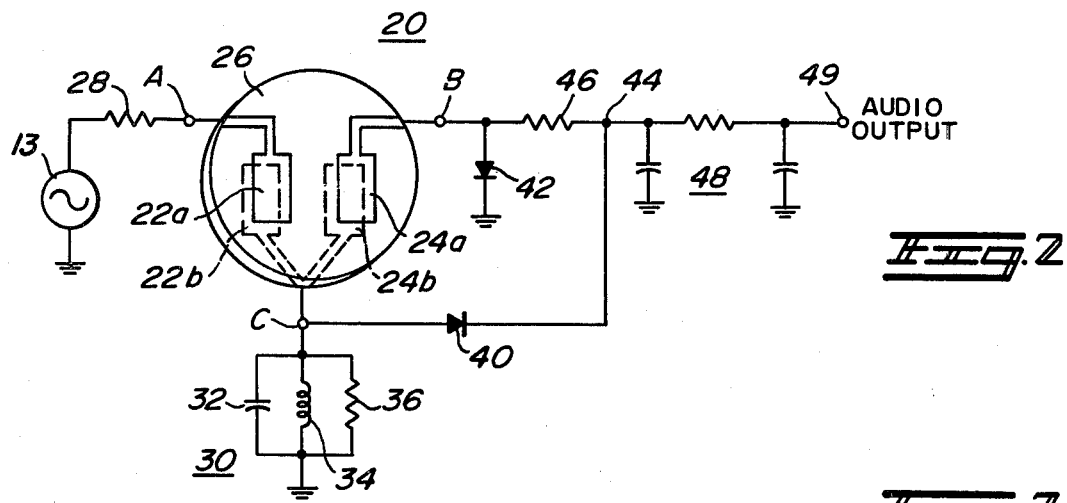
FIG. 2 is a graphic and schematic diagram of a novel two-pole crystal discriminator device which has been constructed in accordance with the present invention.

An improved crystal discriminator arrangement 20 is shown in FIG. 2, which discriminator has been constructed in accordance with the present invention. As will be noted, the discriminator 20 of FIG. 2 includes only first and second electrode pairs designated 22a/22b and 24a/24b. These electrode pairs are deposited on a monolithic crystal wafer of suitable piezoelectric material 26 such as, say for example, a quartz material, in accordance with procedures well known in the art. One electrode of the first electrode pair, say electrode 22a, forms a first port, identified generally as reference A, and serves as the input to which the source of signals identified in FIG. 1 at 13 may be connected. Resistance 28 is the inherent impedance of the input circuit. One electrode of the second pair of electrodes, say electrode 24a, forms a second port, identified generally at reference B, and forms one output of the crystal device 20.

Up to this point, the crystal discriminator is entirely conventional as will be understood by those skilled in the art. Normally, each of the remaining electrodes of the first and second electrode pairs are connected to ground, and conventionally are referred to as the ground electrodes. However in this instance, the remaining electrodes 22b and 24b are utilized to form still a third port identified generally at reference C which, as will be observed, is not connected directly to ground potential. A tuned circuit 30 is utilized for interconnection between port C and ground as illustrated in FIG. 2. The tuned circuitry includes a capacitive element 32 in conjunction with an inductive element 34 interconnected in usual fashion to form the conventional tuned tank circuit. A resistance 36 is further included with components 32 and 34, as illustrated. Accordingly, the output at port C forms still another or second output for the crystal discriminator 20 along with the first output, referenced at port B. The signals appearing at ports B and C are first rectified by the rectifier devices 40 and 42, and then combined at junction 44 with resistance 36 and 46, serving as loading impedances in a manner known in the art. The output of 44 is coupled through an audio filter network 48 to audio output terminal, identified at 49.

Figure 3:
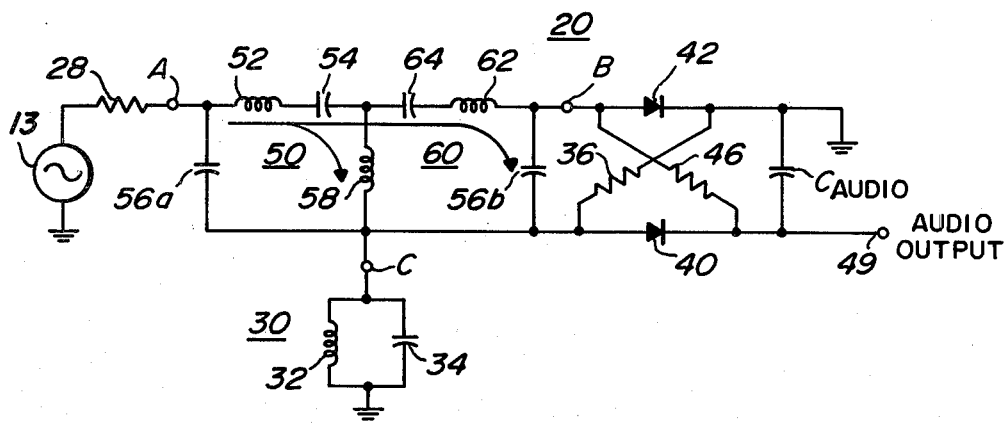
FIG. 3 is a schematic diagram of the equivalent circuit of the crystal discriminator as shown in FIG. 2.

The equivalent circuit for the filter of FIG. 2 is shown in FIG. 3. Discrete elements with previously described and identifiable reference numerals and symbols had been retained where applicable in FIG. 3. In addition, crystal device 20 is shown in schematic representation and, accordingly, includes a pair of bandpass filters 50 and 60. Bandpass filter 50 is formed between the input, or port "A," and the center pin, or port C, as indicated. It consists of an inductance 52 in series with a capacitance 54. A linking shunt inductance 58 is formed between the output of the bandpass filter and the center pin, or port C, as indicated. A second bandpass filter 60 is formed between the center pin, or port "C" and the output, or port "B", as indicated. It consists of inductance 62, in series with capacitance 64 and the coupling inductance 58 modified by the external LC tank circuit (32, 32). Accordingly, inductance 58 is common to the respective bandpass filters 50 and 60. Capacitances 56a and 56b represent the shunt or parasitic capacitance to the substrate of the piezoelectric wafer 26.

As previously described, the output of reference port C appears across load resistor 36 and is rectified by the rectification device 40 before being applied to the audio output terminal 49. Similarly, the output of reference port B appears across load resistance 46 and is rectified by the rectification device 42. The respective outputs are then combined and coupled to the audio output terminal 49.

Figure 4:
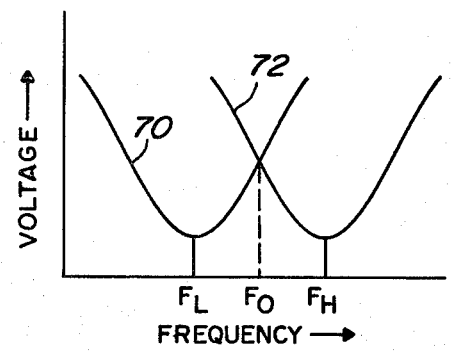
FIG. 4 is a graphic representation of the respective response characteristics that may be expected from the first and second outputs of the crystal discriminator of FIGS. 2 and 3.
Figure 5:
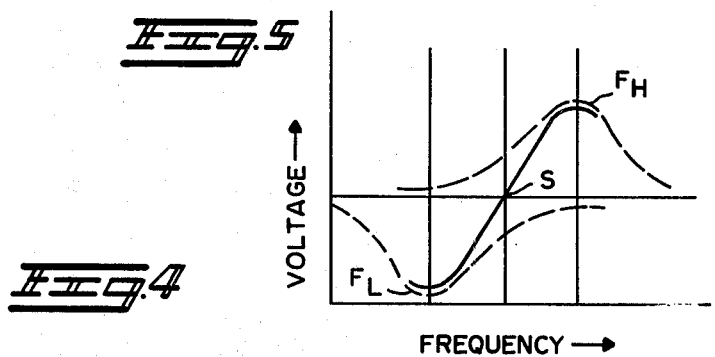
FIG. 5 illustrates the overall bandpass characteristics of the crystal discriminator when the outputs are rectified and combined.

The response characteristics of the respective bandpass filter networks 50 and 60 are shown at 70 and 72 in FIG. 4. Response characteristics 70 represents that of bandpass filter 50 acting as a one-pole filter but modified by the net effect of the loading of the second resonator 24a. Response characteristics 72 represents bandpass filter 60 as modified by the external loading and components connected to reference port C. $F_o$ represents the center frequency of the crystal device as a whole. Accordingly, if the response characteristic 72 for bandpass filter 60 is inverted and combined, the resultant is the conventinal "S" curve as depicted in the FIG. 5. This overall response characteristic is a sum of the curves $F_L$ and $F_H$, as shown in FIG. 4, which represents the two respective passbands with an intermediate linear portion, all as well known in the art.

Accordingly, what has been described is a novel two-pole monolithic crystal frequency discrimintor functioning as a three port device. Smaller size is obtained, substantially wider bandwidth is exhibited than previously available, with known two-pole monolithic crystal discriminators, and no tuning adjustments required. The present device is substantially less complicated to manufacture, and meaningful cost savings are realized in the manufacture thereof.

What is claimed is:

1. A two-pole, monolithic crystal frequency discriminator for deriving an audio output from a received radio frequency signal, comprising in combination:
   a monolithic wafer body of piezoelectric material;
   first and second pairs of electrodes on said wafer to form resonator means and being of a mass for responding to a modulated input signal of a given reference frequency;
   a first input port formed by one electrode of said first electrode pair and adapted to receive said given frequency input signal;
   a second port formed by one electrode of said second electrode pair and serving as a first output;

a third port formed by said other electrodes of said first and second electrode pairs interconnected and serving as a second output;

a tuned circuit connected to said third port;

an audio output terminal; and a first rectification device coupled between said second port and said audio output terminal and a second rectification device coupled between said third port and said audio output terminal.

2. A two-pole monolithic crystal frequency discriminator in accordance with claim 1 wherein said resonator means form respective equivalent bandpass filter circuits between said first and third ports and between said first and second ports.

3. A two-pole monolithic crystal frequency discriminator in accordance with claim 2 wherein said bandpass filter between said first and said third ports exhibits a response characteristic having maximum response at a frequency below said given reference frequency and wherein said bandpass filter between said second and said first ports exhibits a response characteristic having maximum response at a frequency above said given reference frequency.

4. A two-pole monolithic crystal frequency discriminator in accordance with claim 1 wherein said first and second rectification devices are first and second diodes.

5. A two-pole monolithic crystal frequency discriminator in accordance with claim 1 wherein said piezoelectric wafer is formed of quartz crystal.

6. A two-pole monolithic crystal frequency discriminator in accordance with claim 1 wherein said electrode pairs include first and second electrodes opposing one another on opposing faces of said wafer body.

* * * * *

UNITED STATES PATENT AND TRADEMARK OFFICE
CERTIFICATE OF CORRECTION

PATENT NO. : 4,207,535
DATED : June 10, 1980
INVENTOR(S) : Aristotelis S. Arvanitis It is certified that error appears in the above—identified patent and that said Letters Patent is hereby corrected as shown below:

Column 2, line 3, after "heretofore", insert --have--.

Column 3, line 18, delete "separte" and insert --separate--.

Column 3, line 37, delete "as" and insert --at--.

Column 4, line 17, delete "32" (second occurrence) and insert --34--.

Column 4, line 41, delete "conventinal" and insert --conventional--.

Signed and Sealed this

Twentieth Day of January 1981

[SEAL]

Attest:

RENE D. TEGTMEYER

Attesting Officer

Acting Commissioner of Patents and Trademarks